US006967893B2

(12) United States Patent
    Heyne

(10) Patent No.: US 6,967,893 B2
(45) Date of Patent: Nov. 22, 2005

(54) INTEGRATED SYNCHRONOUS MEMORY AND MEMORY CONFIGURATION HAVING A MEMORY MODULE WITH AT LEAST ONE SYNCHRONOUS MEMORY

(75) Inventor: Patrick Heyne, München (DE)

(73) Assignee: Infineon Tecnologies AG, Munich (DE)

( * ) Notice: Subject to any disclaimer, the term of this patent is extended or adjusted under 35 U.S.C. 154(b) by 163 days.

(21) Appl. No.: 10/626,955

(22) Filed: Jul. 25, 2003

(65) Prior Publication Data

US 2004/0022106 A1    Feb. 5, 2004

(30) Foreign Application Priority Data

Jul. 25, 2002 (DE) .............................. 102 33 878

(51) Int. Cl.[7] .............................................. G11C 8/00
(52) U.S. Cl. .................. 365/233; 365/194; 365/189.12
(58) Field of Search ............................. 365/233, 194, 365/189.12, 189.09

(56) References Cited

U.S. PATENT DOCUMENTS 6,628,566 B2 *  9/2003  Jeong .......................... 365/233
6,731,548 B2 *  5/2004  Pax ........................ 365/189.12

* cited by examiner

Primary Examiner—David Lam
(74) Attorney, Agent, or Firm—Laurence A. Greenberg; Werner H. Stemer; Ralph E. Locher

(57) ABSTRACT

An integrated synchronous memory has a register which can store a frequency-range information item regarding whether the memory is operated in a first or in a lower, second frequency range in an application. The mode of operation of a subcircuit in the memory can be controlled on the basis of the stored frequency-range information item in the register. A memory configuration having a memory module on which at least one such synchronous memory is disposed contains a controller which can be connected to the memory module and sets the register in the at least one memory. Therefore, optimum functionality of the memory can be ensured both in a high and in a low frequency range of the operating frequency.

8 Claims, 2 Drawing Sheets

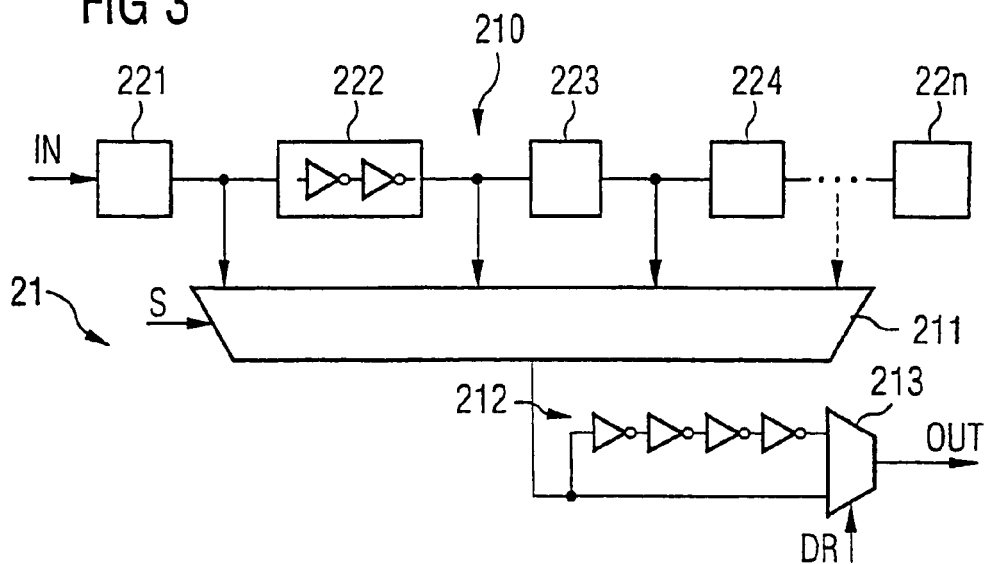
FIG 3
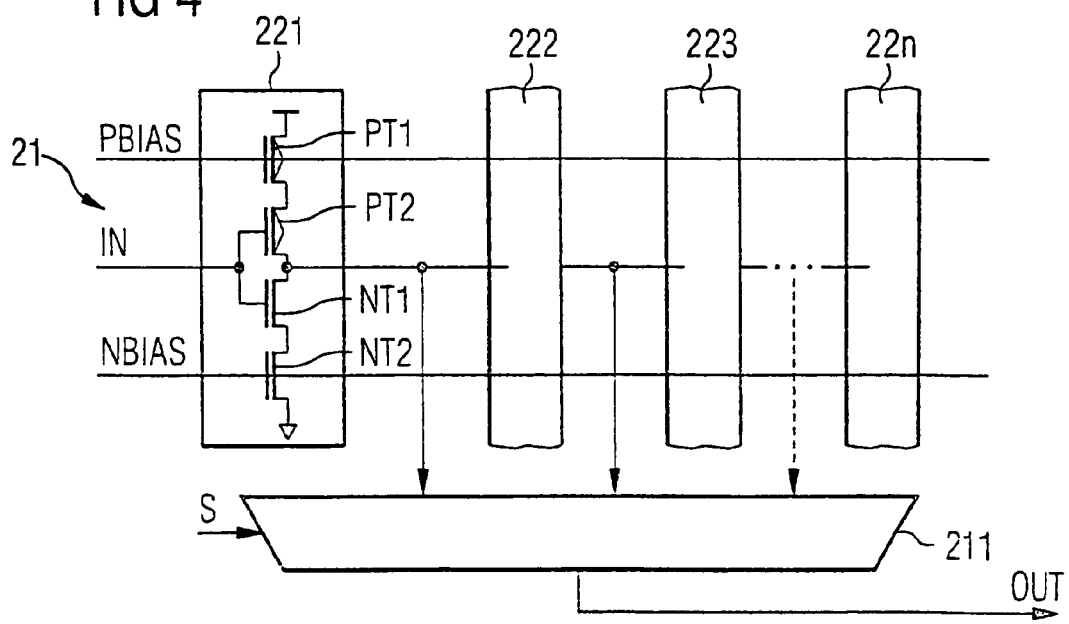
FIG 4
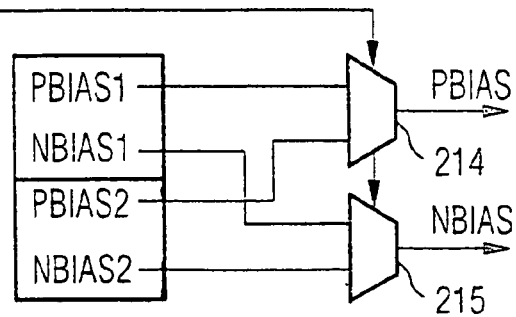

INTEGRATED SYNCHRONOUS MEMORY AND MEMORY CONFIGURATION HAVING A MEMORY MODULE WITH AT LEAST ONE SYNCHRONOUS MEMORY

BACKGROUND OF THE INVENTION

Field of the Invention

The present invention relates to an integrated synchronous memory that can be operated at different operating frequencies and also to a memory configuration having a memory module on which at least one such synchronous memory is disposed.

Integrated synchronous memories, such as synchronous DRAM memories using "Double Data Rate" architecture (DDR DRAMs), have comparatively high switching and access speeds. Such integrated memories generally have a clock signal that is normally supplied externally by a controller, for example. The controller is connected to a connection on the memory or on a memory module on which, usually, a plurality of such memories are disposed. In this context "timing parameters" are specified for the operation of such a memory configuration, for example delay times, which, particularly for read access to a memory, define the relationship between the supplied clock signal and valid data which are to be output. Such timing parameters are generally set using a "delay locked loop (DLL) circuit", on account of process variations in the manufacturing process, temperature variations and with regard to different operating frequencies.

Particularly in the case of DDR DRAMs with high switching speeds, the problem arises that the frequency range of the operating frequency at which the memory operates in normal mode becomes comparatively large. This places great demands on the DLL circuits in the memory, especially. In particular, a variably adjustable delay line of a DLL circuit needs to have a high resolution. A high resolution for a delay line in a DLL circuit is achieved by inverter stages with a short delay, for example. By contrast, a long overall delay in the inverter line needs to be achieved for low frequencies. Accordingly, a large number of inverter stages needs to be provided. A large number of inverter stages is in turn disadvantageous for high operating frequencies, since increased current consumption and losses of yield may result in this case.

SUMMARY OF THE INVENTION

It is accordingly an object of the invention to provide an integrated synchronous memory and a memory configuration having a memory module with at least one synchronous memory that overcomes the above-mentioned disadvantages of the prior art devices of this general type, in which optimum functionality of the memory can be ensured both in a high frequency range and in a low frequency range of the operating frequency.

With the foregoing and other objects in view there is provided, in accordance with the invention, an integrated synchronous memory operable at different operating frequencies. The memory contains a register storing a frequency-range information item regarding whether the integrated synchronous memory operates in a first frequency range or in a second frequency range in an application, the second frequency range being lower than the first frequency range. A subcircuit has a mode of operation controlled on a basis of the frequency-range information item stored in the register, the register is connected to the subcircuit.

It is also an object of the present invention to specify a memory configuration having a memory module on which at least one such synchronous memory is disposed.

The inventive integrated synchronous memory has a register which can store a frequency-range information item regarding whether the memory is operated at least in a first or in a lower, second frequency range in an application. The memory can be operated in two or more different frequency ranges. The stored frequency-range information item in the register can be taken as a basis for controlling the mode of operation of a subcircuit in the memory. Storing the frequency-range information item in the register thus provides the opportunity for optimum alignment of the synchronous memory functionality both with high operating frequencies and with low operating frequencies by using the information item to control the mode of operation of subcircuits in the memory.

The inventive memory configuration has a memory module on which at least one such synchronous memory is disposed, and also a controller that can be connected to the memory module and sets the register in the memory or memories in the memory module. Therefore, in the application, the controller can notify each memory in the memory module of whether the operating frequency of the memory configuration is in a higher or lower frequency range.

In line with one embodiment of the invention, the frequency-range information item is stored in a "mode register" in the memory. The mode register can be set by the controller, particularly during initialization, using a "Mode Register Set" command (MRS command). The mode register in an SDRAM is intended, in particular, to define a particular operating mode for the SDRAM. The mode register is used to stipulate, by way of example, a burst length, a burst type and the "CAS latency" for the memory. In the mode register, the invention reserves a further bit for the frequency-range information item, for example in order to define two frequency ranges.

In another embodiment of a memory configuration in accordance with the invention, a programmable read-only memory, for example in the form of an EPROM, is provided for storing a module information item regarding the cut-off frequency used for operating the memory module in an application. The controller reads the module information item from the read-only memory and sets the respective register in the integrated memories, disposed on the memory module, with the corresponding frequency-range information item. In one development of such a memory configuration, the memory module is in the form of a "DIMM module", the integrated memories disposed on the memory module are in the form of SDRAMs, and the read-only memory is in the form of an serial programmable device (SPD) register. Such an embodiment of a memory configuration is used in computer systems, in particular. In this case, the SPD register is evaluated by the PC-BIOS.

In line with one advantageous embodiment of the invention, the second, lower frequency range of the operating frequency can be configured as an energy-saving mode of operation for reducing the operating current. In this mode of operation, the controller writes the corresponding frequency-range information item to the respective register in the integrated memories disposed on the memory module. In line with this embodiment, the frequency-range entries in the register can thus be changed by the controller a plurality of times, for example in order to optimize the energy consumption of the memory configuration for mobile applications.

In line with one development of the inventive integrated memory, the subcircuit contains a DLL circuit having a variable delay. The delay of the DLL circuit can be altered on the basis of the stored frequency-range information item in the register. This permits optimal alignment of a DLL circuit with different frequency ranges of an operating frequency.

In accordance with an added feature of the invention, the DLL circuit has a signal path with a delay line. The delay line has parts able to be connected or disconnected on a basis of the frequency-range information item stored in the register.

In accordance with a further feature of the invention, the DLL circuit contains a signal path having a delay line with a series circuit formed of inverter stages. The inverter stages have a switching speed controlled on a basis of the frequency-range information item stored in the register.

Other features which are considered as characteristic for the invention are set forth in the appended claims.

Although the invention is illustrated and described herein as embodied in an integrated synchronous memory and a memory configuration having a memory module with at least one synchronous memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of an embodiment of a DLL circuit in the integrated synchronous memory in accordance with the invention; and FIG. 4 is a circuit diagram of another embodiment of the DLL circuit in the integrated synchronous memory in accordance with the invention.

DESCRIPTION OF THE PREFERRED EMBODIMENTS

Figure 1:
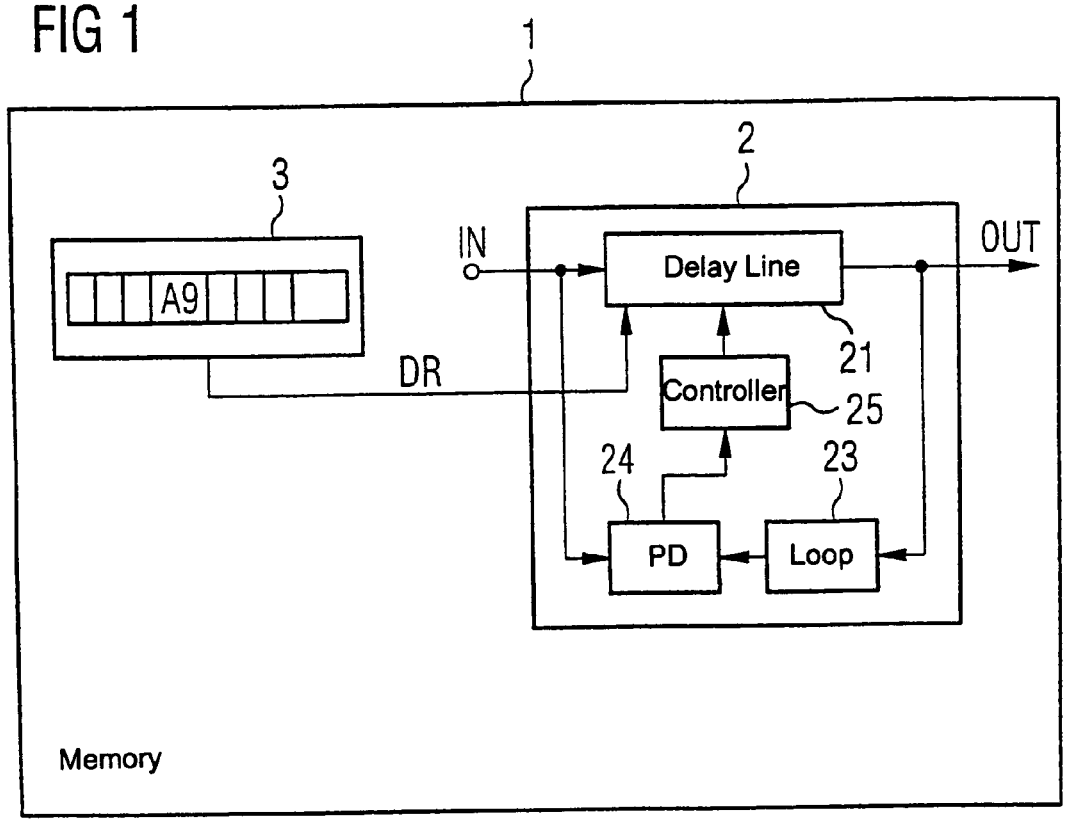
FIG. 1 is a block diagram of an embodiment of an integrated synchronous memory in accordance with the invention.

Referring now to the figures of the drawing in detail and first, particularly, to FIG. 1 thereof, there is shown an integrated synchronous memory 1 which contains a DLL circuit 2. In addition, a mode register 3 is provided which stores, besides a burst length, for example, a burst type and a CAS latency, a frequency-range information item which reveals whether the memory is operated in a higher or a lower frequency range in an application. By way of example, the frequency-range information item is stored in register bit A9 in the mode register 3 and can be read from the register 3 using a signal DR. The register 3 in the present exemplary embodiment is an extended mode register.

FIG. 1 also shows an exemplary embodiment of the DLL circuit 2. At an input IN, a controller applies an external clock signal, for example. At an output OUT, a correspondingly set internal clock signal can be removed. In addition, the DLL circuit has a delay line 21, a feedback loop 23, a phase detector 24 and a control circuit 25. The control circuit 25 is used to make appropriate adjustments to the variably adjustable delay line 21. In addition, the delay line 21 in the DLL circuit 2 can be set on the basis of the stored frequency-range information item DR in the mode register 3. Therefore, the DLL circuit 2 can be notified of whether the memory is operated in the higher or the lower frequency range.

Figure 2:
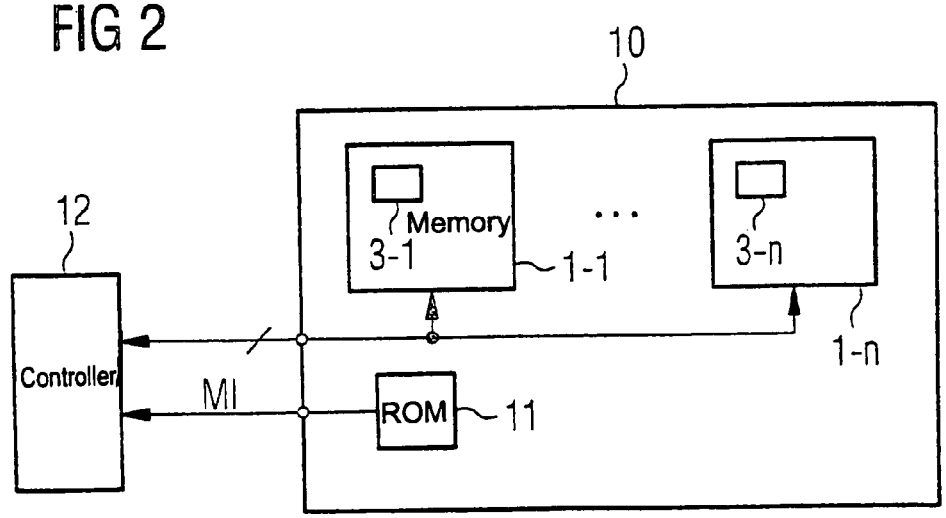
FIG. 2 is a block diagram of an embodiment of an inventive memory configuration with a memory module and a controller.

FIG. 2 shows an embodiment of an inventive memory configuration with a memory module 10 and a controller 12. In the present exemplary embodiment, a plurality of synchronous memories 1-1 to 1-n with a respective mode register 3-1 to 3-n are disposed on the memory module 10. The controller 12 is connected to the memory module 10 and to each of the memories 1-1 to 1-n. The memory module 10 also has a programmable read-only memory 11 on it in the form of an EPROM which is used for storing a module information item regarding the cut-off frequency at which the memory module 10 is operated in an application.

The module information item MI can be read by the controller 12, for example when initializing a computer system that contains the memory configuration shown. The controller 12 then sets the respective register 3-1 to 3-n with the corresponding frequency-range information item. In the embodiment shown in FIG. 2, the memory module 10 is in the form of a DIMM module, the memories 1-1 to 1-n are in the form of SDRAMs, and the read-only memory 11 is in the form of an SPD register. In addition, the controller 12 writes a corresponding frequency-range information item to the registers 3-1 to 3-n in the respective memories 1-1 to 1-n for an energy-saving mode of operation of the memory configuration. In the energy-saving mode of operation, the memories 1-1 to 1-n are operated in the low frequency range.

If the memories 1-1 to 1-n are not disposed on a DIMM module having a read-only memory 11, as shown in FIG. 2, but rather are part of a graphic system, the registers 3-1 to 3-n are set by the controller 12 without prior reading of a read-only memory. In this context, the respective frequency-range information item is stipulated by the manufacturer of the graphic system, who knows the memory type used.

FIG. 3 shows an embodiment of a variably adjustable DLL circuit in an inventive integrated memory as shown in FIG. 1. A delay line 21 has a plurality of delay line sections 210 and 212. The delay line 210 contains a plurality of inverter stages 221 to 22n, with the connecting nodes of the inverter stages being connected to a multiplexer 211. A respective connecting node is selected and advanced using control signal S from the control circuit 25. A multiplexer 213 selects whether the delay line 212 is connected to the delay line 210 on the basis of the frequency-range information item DR. In this case, the additional delay line 212 is activated for the lower frequency range. The delay time in the delay line 212 is many times greater than the delay time of the element 222 in this case.

FIG. 4 shows another embodiment of the DLL circuit in the memory as shown in FIG. 1. The delay line 21 contains a series circuit containing inverter stages 221 to 22n. Each inverter stage contains an inverter with switching transistors PT2 and NT1 and current-source transistors PT1 and NT2. The switching speed of the inverter stages 221 to 22n can be controlled by varying the switching voltage of the transistors PT1 and NT2. The control voltages PBIAS and NBIAS are set on the basis of the frequency-range information item DR using the multiplexer 214 and 215. The voltages PBIAS1 and NBIAS2 have higher values than the voltages PBIAS2 and NBIAS1. To set a lower frequency range, a comparatively high voltage PBIAS1 and a comparatively low voltage NBIAS1 are applied to the respective current-source transistors PT1 and NT2. These transistors therefore have a comparatively low current driver capability. To set a higher frequency range, the voltage PBIAS is lowered and the voltage NBIAS is raised (PBIAS2, NBIAS2). In this context, multiplexers 214 and 215 are actuated on the basis of the frequency-range information item DR.

I claim:

1. An integrated synchronous memory operable at different operating frequencies, comprising:
    a register storing a frequency-range information item regarding whether the integrated synchronous memory operates in a first frequency range or in a second frequency range in an application, the second frequency range being lower than the first frequency range; and
    a subcircuit having a mode of operation controlled on a basis of the frequency-range information item stored in said register, said register connected to said subcircuit;
    said subcircuit containing a delay locked loop circuit having a variable delay, the variable delay of said delay locked loop circuit being altered on a basis of the frequency-range information item stored in said register.

2. The integrated synchronous memory according to claim 1, wherein said register is a mode register.

3. The integrated synchronous memory according to claim 1, wherein said delay locked loop circuit has a signal path with a delay line, said delay line having parts being able to be connected or disconnected on a basis of the frequency-range information item stored in said register.

4. The integrated synchronous memory according to claim 1, wherein said delay locked loop circuit contains a signal path having a delay line with a series circuit formed of inverter stages, said inverter stages having a switching speed controlled on a basis of the frequency-range information item stored in said register.

5. The integrated synchronous memory according to claim 4, wherein said inverter stages have current sources with a current driver capability controlled on a basis of the frequency-range information item stored in said register.

6. A memory configuration, comprising:
    a memory module having at least one synchronous memory, said synchronous memory containing:
        a register storing a frequency-range information item regarding whether said synchronous memory operates in a first frequency range or in a second frequency range in an application, the second frequency range being lower than the first frequency range; and
        a subcircuit whose mode of operation can be controlled on a basis of the frequency-range information item stored in said register, said register connected to said subcircuit;
    a controller connected to said memory module and setting said register; and
    a programmable read-only memory storing a module information item regarding a cut-off frequency used for operating said memory module in an application, said controller reading the module information item from said programmable read-only memory and setting said register in said synchronous memory with a corresponding frequency-range information item.

7. The memory configuration according to claim 6, wherein said memory module is a DIMM module, said synchronous memory is an SDRAM, and said programmable read-only memory is an SPD register.

8. The memory configuration according to claim 6, wherein said controller, in an energy-saving mode of the memory configuration, writes the frequency-range information item to said register of said synchronous memory to operate said synchronous memory in the second frequency range in the application.

* * * * *